(12) United States Patent
Abdo et al.

(10) Patent No.: US 10,176,432 B2
(45) Date of Patent: Jan. 8, 2019

(54) WEAKLY TUNABLE QUBIT BASED ON TWO COUPLED DISPARATE TRANSMONS

(71) Applicant: INTERNATIONAL BUSINESS MACHINES CORPORATION, Armonk, NY (US)

(72) Inventors: Baleegh Abdo, Fishkill, NY (US); Jay Gambetta, Yorktown Heights, NY (US); Jared B. Hertzberg, Ossining, NY (US); Easwar Magesan, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/451,783

(22) Filed: Mar. 7, 2017

(65) Prior Publication Data

US 2018/0260729 A1    Sep. 13, 2018

(51) Int. Cl.

| | | |
|---|---|---|
| *H03K 19/195* | (2006.01) | |
| *H01L 29/02* | (2006.01) | |
| *H01L 29/06* | (2006.01) | |
| *G02B 6/34* | (2006.01) | |
| *H01L 39/24* | (2006.01) | |
| *G06F 17/11* | (2006.01) | |
| *G06N 99/00* | (2010.01) | |
| *H01L 39/02* | (2006.01) | |
| *H01L 39/22* | (2006.01) | |

(52) U.S. Cl.
CPC ......... *G06N 99/002* (2013.01); *H01L 39/025* (2013.01); *H01L 39/223* (2013.01)

(58) Field of Classification Search
CPC ... G06N 99/002; H01L 39/025; H01L 39/223; H03K 19/195; H03K 3/38; H04B 10/90
USPC .................................................. 327/524–602
See application file for complete search history.

(56) References Cited

U.S. PATENT DOCUMENTS

| | | | |
|---|---|---|---|
| 6,987,282 B2 | 1/2006 | Amin et al. | |
| 7,613,765 B1* | 11/2009 | Hilton | ................. G06N 99/002 708/801 |
| 7,847,615 B2 | 12/2010 | Yorozu et al. | |
| 7,969,805 B2 | 6/2011 | Thom et al. | |
| 8,102,185 B2* | 1/2012 | Johansson | ............ G06N 99/002 326/3 |

(Continued)

FOREIGN PATENT DOCUMENTS

| | | |
|---|---|---|
| CN | 1419660 A | 5/2003 |
| CN | 1870015 A | 11/2006 |

(Continued)

OTHER PUBLICATIONS

Gambeffa et al., "A superconducting qubit with Purcell protection and tunable coupling," arXiv:1009.4470v1, Sep. 22, 2010, pp. 1-4.

(Continued)

*Primary Examiner* — Brandon S Cole
(74) *Attorney, Agent, or Firm* — Cantor Colburn LLP; Vazken Alexanian

(57) ABSTRACT

A technique relates to providing a superconducting quantum device. A fixed frequency transmon qubit is provided. A tunable frequency transmon qubit is provided. The fixed frequency transmon qubit is coupled to the tunable frequency transmon qubit to form a single qubit.

25 Claims, 8 Drawing Sheets

(56) References Cited

U.S. PATENT DOCUMENTS

| | | | |
|---|---|---|---|
| 9,379,303 B2 | 6/2016 | Gambetta et al. | |
| 9,425,804 B2 | 8/2016 | McDermott, III et al. | |
| 2003/0173997 A1* | 9/2003 | Blais | B82Y 10/00 327/34 |
| 2004/0077503 A1* | 4/2004 | Blais | B82Y 10/00 505/190 |
| 2005/0224784 A1* | 10/2005 | Amin | B82Y 10/00 257/14 |
| 2006/0147154 A1* | 7/2006 | Thom | B82Y 10/00 385/37 |
| 2007/0080341 A1* | 4/2007 | Macready | B82Y 10/00 257/31 |
| 2009/0192041 A1* | 7/2009 | Johansson | B82Y 10/00 505/170 |
| 2010/0194466 A1* | 8/2010 | Yorozu | B82Y 10/00 327/528 |
| 2011/0047201 A1* | 2/2011 | Macready | B82Y 10/00 708/446 |
| 2011/0054876 A1* | 3/2011 | Biamonte | B82Y 10/00 703/15 |
| 2016/0079968 A1* | 3/2016 | Strand | H01L 39/2493 327/528 |
| 2016/0087599 A1 | 3/2016 | Naaman et al. | |
| 2016/0233965 A1* | 8/2016 | Medford | G06N 99/002 |
| 2016/0267032 A1* | 9/2016 | Rigetti | G06N 99/002 |
| 2016/0292586 A1* | 10/2016 | Rigetti | G06N 99/002 |
| 2016/0292587 A1 | 10/2016 | Rigetti et al. | |
| 2017/0230050 A1* | 8/2017 | Rigetti | H03K 19/195 |

FOREIGN PATENT DOCUMENTS

| | | |
|---|---|---|
| CN | 103582949 A | 2/2014 |
| WO | 2016000836 A1 | 1/2016 |

OTHER PUBLICATIONS

Koch et al., Charge insensitive qubit design derived from the Cooper pair box, PRA 76, 042319, Sep. 26, 2007, pp. 1-21.

Orlando et al., "A Superconducting Persistent Current Qubit," arXiv:cond-mat/9908283v2 23, 1999, pp. 1-15.

Orlando et al., "Superconducting persistent-current qubit," Physical Review B, DOI: 10.1103/PhysRevB.60.15398, 1999, pp. 1-17.

Steffen et al., "High coherence hybrid superconducting qubit," arXiv:1003.3054v1, Mar. 16, 2010, pp. 1-4.

Strand et al., "First-order sideband transitions with flux-driven asymmetric transmon qubits," PRB 87, 220505(R), Jun. 21, 2013, pp. 1-5.

Yan et al., "The Flux Qubit Revisited to Enhance Coherence and Reproducibility," arXiv:1508.06299v4, Nov. 4, 2016, pp. 1-55.

PCT/IB2017/057383 International Search Report and Written Opinion, dated Mar. 7, 2018.

* cited by examiner

FIG. 3  TABLE 1 : CALCULATED QUBIT PROPERTIES FOR A PARTICULAR DESIGN PARAMETERS

| Working point | $\Phi_{ext}$ | |
|---|---|---|
| | 0 | $\Phi_0/2$ |
| Qubit frequency $f_q$ | 4.767 GHz | 4.814 GHz |
| Anharmonicity | 255 MHz | 270 MHz |
| Charge dispersion | $4 \cdot 10^{-6}$ GHz | $1.6 \cdot 10^{-5}$ GHz |
| Single photon transitions | 0-1 ($f_q$), 0-4 | 0-1 ($f_q$), 0-7 |

FIG. 8

PROVIDE THE SINGLE QUBIT CONFIGURED AS A FIXED FREQUENCY TRANSMON QUBIT COUPLED TO A TUNABLE FREQUENCY TRANSMON QUBIT  802

↓

GENERATE THE ENERGY SYSTEM OF THE SINGLE QUBIT AS A V ENERGY SYSTEM SUCH THAT READOUT OF THE SINGLE QUBIT IS CONFIGURED TO BE PERFORMED BY COUPLING TO A 4TH ENERGY LEVEL OR A 7TH ENERGY LEVEL OF THE SINGLE QUBIT  804

WEAKLY TUNABLE QUBIT BASED ON TWO COUPLED DISPARATE TRANSMONS

BACKGROUND

The present invention relates generally to superconducting electronic devices, and more specifically, to a weakly tunable qubit based on two coupled disparate transmons.

The fundamental element of a quantum computer is the quantum bit which is known as the "qubit". As opposed to a classical bit, representing zero and one, a qubit is also able to represent a quantum superposition of the two states. The states can be formalized within the laws of quantum physics as a probability of being in the two states. Accordingly, the states can be manipulated and observed within the laws of quantum physics.

SUMMARY

According to embodiments of the present invention, a method of providing a superconducting quantum device is provided. The method includes providing a fixed frequency transmon qubit and providing a tunable frequency transmon qubit. The method includes coupling the fixed frequency transmon qubit to the tunable frequency transmon qubit to form a single qubit.

According to embodiments of the present invention, a superconducting quantum device is provided. The superconducting quantum device includes a fixed frequency transmon qubit, and a tunable frequency transmon qubit. The fixed frequency transmon qubit is coupled to the tunable frequency transmon qubit in order to form a single qubit.

According to embodiments of the present invention, a method of configuring a single qubit is provided. The method includes providing a single Josephson junction (JJ) shunted by a first capacitor, and providing an asymmetric direct current superconducting quantum interference device (dc-SQUID) shunted by a second capacitor. The method includes connecting the single JJ to the dc-SQUID through one shared node.

According to embodiments of the present invention, a single qubit is provided. The single qubit includes a single Josephson junction (JJ) transmon qubit shunted by a first capacitor, and an asymmetric direct current superconducting quantum interference device (dc-SQUID). The asymmetric dc-SQUID is shunted by a second capacitor.

According to embodiments of the present invention, a method of providing an energy system of a single qubit is provided. The method includes providing the single qubit configured as a fixed frequency transmon qubit coupled to a tunable frequency transmon qubit. The method includes generating the energy system of the single qubit as a V energy system such that readout of the single qubit is configured to be performed by coupling to a $4^{th}$ energy level or a $7^{th}$ energy level of the single qubit.

In an aspect of embodiments, the fixed frequency transmon qubit shares a node with the tunable frequency transmon qubit and both the fixed frequency transmon qubit and the tunable frequency transmon qubit are capacitively coupled via a coupling capacitor.

BRIEF DESCRIPTION OF THE DRAWINGS

FIG. 3 is table illustrating a design example of the qubit circuit according to one or more embodiments.

FIG. 8 is a flow chart of a method of providing an energy system of a single qubit according to one or more embodiments.

DETAILED DESCRIPTION

Figure 1:
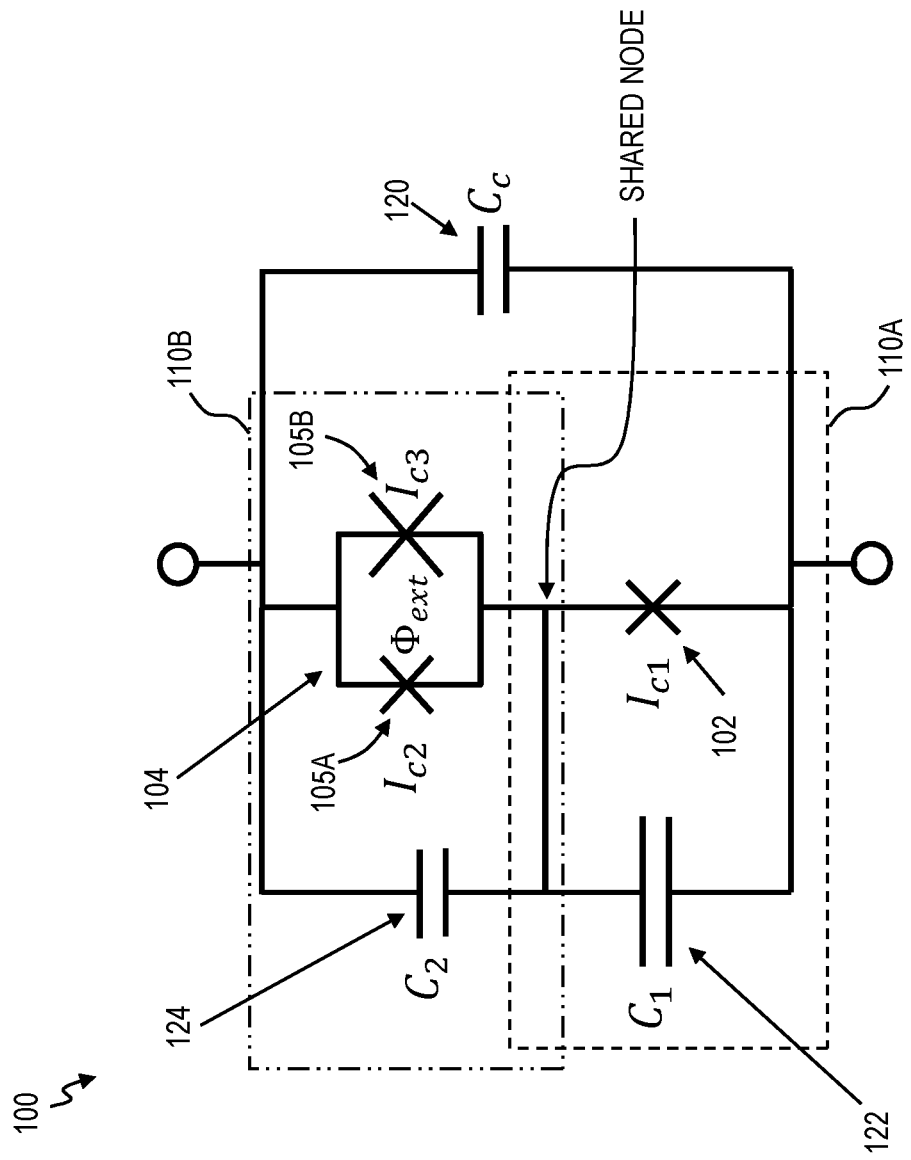
FIG. 1 is a circuit of a weakly tunable qubit according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Several physical systems have been suggested as potential implementations of qubits. However, solid-state circuits, and superconducting circuits in particular, are of great interest as they offer scalability which is the possibility of making circuits with a larger number of interacting qubits. Superconducting qubits are typically based on Josephson junctions (JJ). A Josephson junction is two superconductors coupled by, for example, a thin insulating barrier. A Josephson junction can be fabricated by means of an insulating tunnel barrier, such as $Al_2O_3$, between superconducting electrodes. For such superconductor-insulator-superconductor (SIS) Josephson junctions, the maximum allowed supercurrent is the critical current $I_c$. Superconducting qubits having a tunable critical current (e.g., based on Josephson junctions) are generally useful in the field of quantum computing, and have been realized using a so-called superconducting quantum interference device (SQUID), which allows the qubit frequency to be tuned by means of an external magnetic field. The SQUID is two JJs in parallel, thereby forming a loop through which a magnetic field can be applied. In this configuration, the SQUID is called a dc-SQUID. Several problems are however related to a tunable frequency qubit, in particular, to a superconducting qubit whose frequency is tuned through the application of external magnetic flux. For example, an external magnetic field could decrease the ratio of the Josephson energy and the charging energy, thereby introducing sensitivity to charge noise. As another example, the larger the frequency tunability of the qubit as a function of magnetic flux, the larger the sensitivity of the qubit to flux noise, where such noise can decrease the coherence times of the qubit.

Quantum error-correction schemes rely on arrays of qubits coupled together and acted on by external control to perform quantum gate operations. In quantum computing and specifically the quantum circuit model of computation, a quantum gate (or quantum logic gate) is a basic quantum circuit operating on a small number of qubits. They are the building blocks of quantum circuits, like classical logic gates are for conventional digital circuits. The most common quantum gates operate on spaces of one or two qubits, just like the common classical logic gates operate on one or two bits.

Fixed-frequency superconducting transmon qubits and microwave cross-resonance gates offer a simple and robust architecture for such a system, but they are very sensitive to the relative frequencies of adjacent qubits. These frequencies are in turn very sensitive to the detailed nanostructure of the Josephson junctions in the qubits. In practice, fixed-frequency 5 GHz qubits are difficult to prepare with frequency precision better than about plus or minus (±) 4%. A flux-tunable transmon qubit design (that is based on a dc-SQUID, with symmetric or asymmetric Josephson junctions) offers the ability to adjust frequencies to optimize the gate operation. However, the range of tunability should be made very small (particularly about 100 MHz in accordance with one or more embodiments) or else the tunability will increase the sensitivity to quantum state dephasing through the action of flux noise. At the same time, the Josephson junction in any tunable frequency qubit design should not exceed certain limits on junction size. Excess junction size can complicate junction fabrication, add undesired junction capacitance, and/or incorporate randomly occurring defects such as two-level-system dissipators. One or more embodiments of the present invention provide a modified transmon qubit design that is configured to achieve sub-100 MHz tuning range, without requiring excessive junction sizes.

Various limitations in state-of-the-art tunable transmon schemes are discussed below. As noted above, transmon qubits typically employ a single Josephson junction having a critical current $I_{c1}$. If the critical current is to be made tunable, a scheme is employed using a pair of Josephson junctions of critical currents $I_{c2}$ and $I_{c3}$, in a SQUID loop, with $I_{c3} > I_2$. An external field coil (not shown) adjusts the magnetic flux in the loop, allowing the combined critical current of the junctions to be adjusted by a fraction equaling the ratio $2 I_{c2}/(I_{c2}+I_{c3})$. The qubit frequency scales approximately as the square root of critical current, thus the tunability relies on the ratio of critical currents $I_{c3}/I_{c2}$, which in turn depends directly on the ratio of Josephson junction areas. Therefore, this state-of-the-art tunable scheme has several limitations:

1) Fabrication limits on junction size. In present fabrication systems using electron-beam lithography, it is challenging to reliably make Josephson junctions smaller than about 60 nanometers (nm)×60 nm (or 3600 square nanometer ($nm^2$)). More commonly, the junctions are made with an area of about 90 nm×90 nm (e.g., 8100 $nm^2$). To achieve a 100 MHz tunability (as provided in one or more embodiments) would require $I_{c2}$ provided by a 60 nm×60 nm or 90 nm×90 nm junction, and $I_{c3}$ provided by a junction area that is 50 times larger than the junction area of $I_{c2}$, i.e., 424 nm×424 nm or 636 nm×636 nm (e.g., 180,000 $nm^2$ or 405,000 $nm^2$, respectively). In practice, it is difficult to simultaneously make these dissimilar junction areas in the same device. A ratio of 15:1 in areas (which yields about 330 MHz tunability) is more commonly achieved in the state-of-the-art.

2) Junction capacitance. The transmon design relies on shunting the junction with a large capacitance so as to reduce the charge dispersion of the device and make it immune to local charge noise effects. This capacitance can be carefully controlled by photolithographically defined features which can be about 65 femtofarads (fF). The junction also contributes capacitance in an amount of about 4 fF. If the junctions are redesigned to make them much larger, these junctions will contribute excess undesired capacitance to the qubit.

3) Defects included in the junction. Two-level system (TLS) defects can arise in the amorphous structure of the junction barrier dielectric. Any of these defects in the junctions lying close in frequency to the qubit will couple to the qubit and degrade the qubit's coherence. It is estimated that a typical junction of size 100,000 $nm^2$ will incorporate such defects at an energy density of 1 every 3 GHz. The junction thus has about a 1 in 60 probability of being within 50 MHz of such a defect. However, the population of TLSs scales directly with area so that a 405,000 $nm^2$ junction would have about a 1 in 15 probability. If one wishes to avoid TLS coupling, one must keep the junctions small.

Embodiments of the present invention address limitations in the state-of-the-art design schemes. According to one or more embodiments of the present invention, structures and methods are provided to create a weakly tunable qubit. The weakly tunable qubit is configured to preserve the main transmon characteristics of qubit frequency, moderate anharmonicity, and small charge dispersion by capacitively coupling a single junction transmon to an asymmetric dc-SQUID transmon. By tuning the magnetic external flux $\Phi_{ext}$ threading the asymmetric dc-SQUID transmon loop, the resonance frequency of the asymmetric dc-SQUID oscillator changes, and because of the capacitive coupling and/or impedance loading, the change in resonance frequency of the asymmetric dc-SQUID oscillator induces a shift in the resonance frequency of the qubit (i.e., qubit frequency), whose resonance frequency is dominated by the non-tunable transmon qubit. Such a frequency shift of the qubit can be explained in terms of a $\chi$ shift of the single-JJ transmon frequency.

Now turning to the figures, FIG. 1 is a circuit of a weakly tunable qubit 100 according to one or more embodiments. The qubit 100 is weakly tunable because the tunable range of the resonance frequency (i.e., qubit frequency $f_q$) of the qubit circuit 100 is reduced or limited (i.e., weakly tunable), thereby allowing us to avoid frequency collisions with other qubit circuits and/or operation frequencies, while at the same time reducing the sensitivity of the qubit to flux noise. It should be understood that the qubit circuit 100 is coupled to other qubit circuits 100 in an array or matrix, thereby forming a quantum computing processor as understood by one skilled in the art. In some embodiments, the tunable range of the resonance frequency (i.e., qubit frequency $f_q$) is about 100 MHz. In other embodiments, the resonance frequency of the qubit 100 is tunable in a sub-100 MHz tuning range. In other embodiments, the resonance frequency of the qubit 100 is tunable with a 50 MHz or smaller tuning range. It should be appreciated that the tunability of embodiments are much less than the state-of-the-art tunable transmon qubits (which are about 300 MHz), without suffering from the issues discussed above. Tunable means that the qubit frequency $f_q$ of the qubit 100 can increase or decrease by a certain amount (MHz), and this range has been limited/reduced in the new design in accordance with embodiments, thereby making the tunable qubit 100 weakly tunable. For example, if the qubit frequency $f_q$ of the qubit 100 is, for example, 4.5 GHz with a 100 MHz tunability, then the qubit frequency of the qubit 100 can be tuned as low as 4.45 GHz to as high as 4.55 GHz.

The qubit 100 includes a fixed frequency transmon qubit 110A and a tunable frequency transmon qubit 110B, which share one electrode and are coupled together via coupling capacitor Cc 120. The transmon qubit 110A includes a single JJ 102 having critical current denoted $I_{c1}$. The transmon qubit 110A is a fixed frequency qubit and is not tunable. The single JJ 102 in the transmon qubit 110A is shunted by a capacitor $C_1$ 122.

The transmon qubit 110B includes an asymmetric dc-SQUID 104 shunted by a capacitor $C_2$ 124. In the weakly tunable qubit 100, the capacitor $C_1$ 122 has a value greater than the capacitor $C_2$ 124. The asymmetric dc-SQUID 104 is formed by JJ 105A and JJ 105B connected together in a loop. The asymmetric dc-SQUID 104 is tunable by the external magnetic flux $\Phi_{ext}$ threading the asymmetric dc-SQUID transmon loop. The JJ 105A is a smaller Josephson junction (i.e., superconducting-insulator-superconductor) with a smaller area than the larger JJ 105B. The JJ 105A has critical current $I_{c2}$ and the JJ 105B has critical $I_{c3}$. Since the JJ 105B is larger than the JJ 105A, the superconducting critical current $I_{c3}$ is larger than the critical current $I_{c2}$. In one implementation, the critical current $I_{c1}$ and $I_{c2}$ can be about equal.

As can be seen, the new qubit 100 is formed by coupling the two transmon qubits 110A and 110B together but the qubit 100 behaves/functions as a single qubit with a defined transition frequency (i.e., qubit frequency $f_q$). The combination of the asymmetric dc-SQUID 104 in the tunable frequency transmon 110B and the single JJ 102 in the fixed frequency transmon 110A cause the qubit 100 to have a reduced or limited tunable range. For example, the resonance frequencies of both the fixed single JJ 102 (transmon qubit 110A) and dc-SQUID 104 (transmon qubit 110B) contribute to the resonance frequency $f_q$ of the qubit 100, but the resonance frequency of fixed single JJ 102 which is not tunable has a more dominant effect on the resonance frequency $f_q$. By having the dissimilar JJs 105A and 105B in the dc-SQUID 104, a limited tunability is introduced to the qubit 100. As compared to a typical tunable transmon containing a dc-SQUID, the tunable range of the qubit 100 is limited because the dc-SQUID 104 contributes only partially to the total critical current, with the fixed single JJ 102 making the dominant contribution to the resonance frequency.

The circuit elements of the qubit circuit 100 are made of superconducting material. Examples of superconducting materials (at low temperatures, such as about 10-100 millikelvin (mK), or about 4 K) include niobium, aluminum, tantalum, etc. For example, the JJs 102, 105A, and 105B are made of superconducting material, and their tunnel junctions can be made of a thin tunnel barrier, such as an oxide. The capacitors $C_1$, $C_2$, and $C_C$ are made of superconducting material separated by dielectric material. The wires connecting the various elements are made of a superconducting material.

Figure 2:
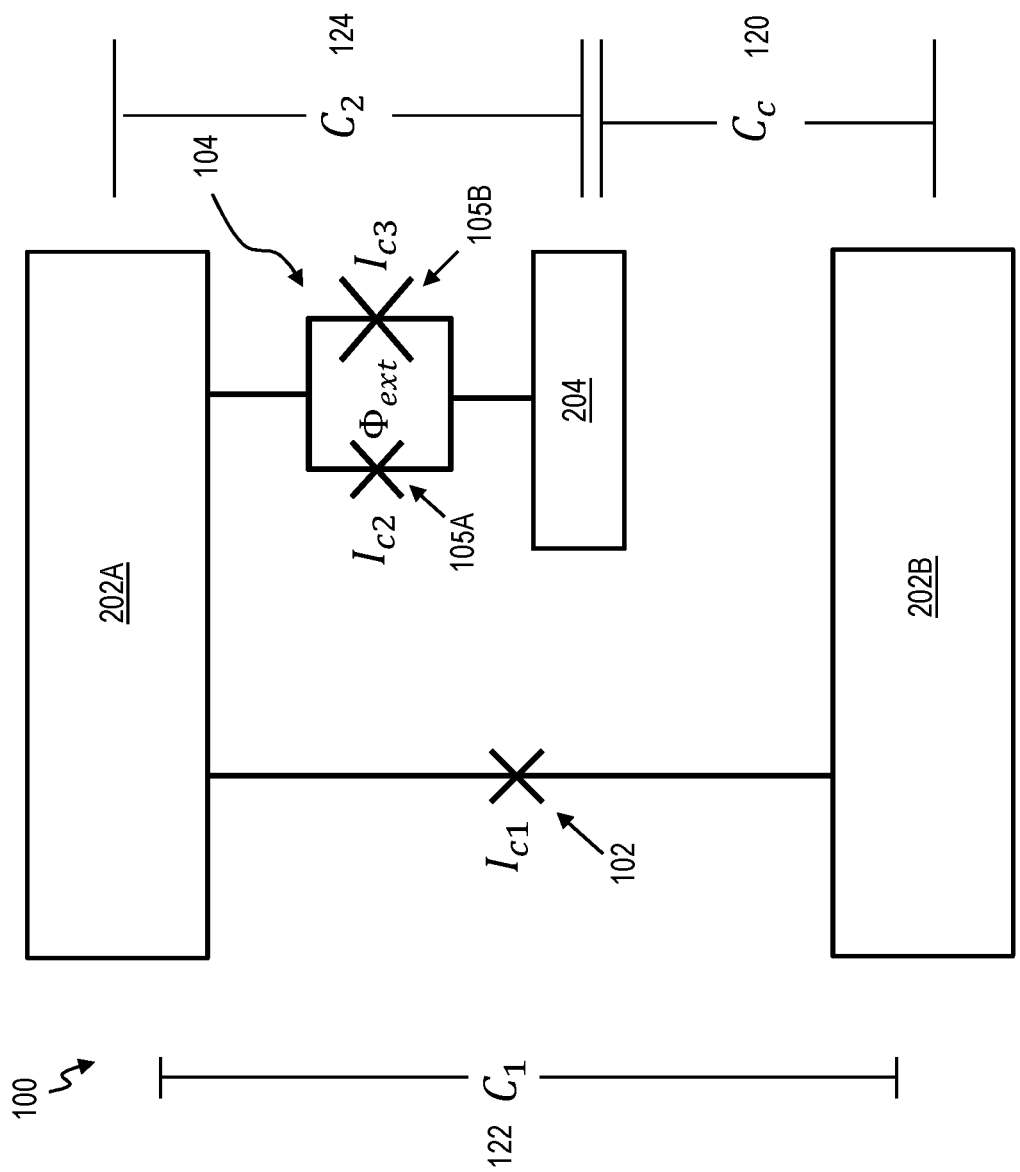
FIG. 2 is an example implementation of the qubit circuit according to one or more embodiments.

FIG. 2 is an example implementation of the qubit circuit 100 according to one or more embodiments. In FIG. 2, the qubit circuit 100 includes two large superconducting pads 202A and 202B. The single JJ 102 is connected to the two large pads 202A and 202B. The capacitor $C_1$ 122 is formed between the two large pads 202A and 202B.

The dc-SQUID 104 is connected to one large pad, for example, large superconducting pad 202A, and connected to a small superconducting pad 204. The small pad 204 is smaller than the large pad 202A. The capacitor $C_2$ 124 is formed between the large pad 202A and the small pad 204. The coupling capacitor $C_C$ 120 is formed between the large pad 202A and the small pad 204. Although not shown for simplicity, the qubit circuit 100 can be formed on a substrate such as a wafer. The wafer can be a silicon wafer, a sapphire wafer or other substrate material used in microfabrication.

FIG. 2 is simply one example implementation, and it is understood that there are other implementations of the qubit circuit 100. Various parameters of the circuit elements can be modified to achieve the desired result in accordance with one or more embodiments. There can be modifications in the location of the pads 202A, 202B, 204, the size of the pads 202A, 202B, 204, and/or the distance between the pads 202A, 202B, 204. The distance between the pads 202A, 202B, 204 affects the values of the capacitors $C_C$, $C_1$, $C_2$.

For explanation purposes and not limitation, FIG. 3 is Table 1 illustrating calculated qubit properties for a certain design example of the qubit circuit 100 according to one or more embodiments. In the design example, $I_{c1}=I_{c2}=27$ nanoamperes (nA) and $I_{c3}=81$ nA. Also, for the capacitors, $C_1=55$ fF, $C_2=20$ fF, and $C_C=25$ fF. In this design example, the tunability range is 48 MHz, which means the qubit frequency $f_q$ of the qubit 100 can be tuned 24 MHz above and below the average frequency of the qubit.

For the design example, the Table 1 depicts qubit properties of the qubit 100. The qubit properties are illustrated for two cases of the external magnetic flux $\Phi_{ext}$ threading the asymmetric dc-SQUID transmon loop. In the first case, external magnetic flux $\Phi_{text}$ is 0 which means no flux threads the loop. In the second case, external magnetic flux $\Phi_{ext}$ is equal to $\Phi_0/2$ which is known as one half flux quantum, where $\Phi_0$ is one flux quantum. The (superconducting) magnetic flux quantum is $\Phi_0=h/(2e)$ which is a combination of fundamental physical constants of Planck's constant h and the electron charge e, equaling $2.0678 \times 10^{-15}$ Wb.

In the design example, the qubit frequency $f_q$ remains in the desired operation range which is generally between 4 and 5 GHz even when tuned. This frequency range is commonly used in superconducting qubits because it is high enough to avoid thermal occupation of qubit states when qubits are operated in a dilution refrigerator, while also being low enough to avoid most spurious microwave resonances and to facilitate operations with readily available microwave electronics. Although the design example is intended to be in the microwave range of 4 to 5 GHz which is typically utilized, it should be appreciated that the qubit frequency can be other frequencies. Of the other properties listed in Table 1, the anharmonicity is a measure of the distinctness of successive energy levels in the qubit energy spectrum. An anharmonicity exceeding 200 MHz is desirable (but not a necessity) in order to clearly distinguish the first and second energy transitions of the qubit. Charge dispersion of the qubit indicates the qubit's ability to be tuned with an external charge. Such a behavior is undesirable as charge noise in a qubit system can cause random tuning and lead to decoherence. A small charge dispersion (well under 100 kHz) is to be preferred (but not a necessity) in any functional qubit state. The last row of Table 1 pertains to the behaviors described in FIGS. 4 and 5.

Figure 4:
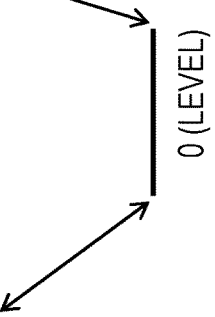
FIG. 4 is a V energy spectrum (V-system) of the qubit according to one or more embodiments.

FIG. 4 is a V energy spectrum (V-system) of the qubit 100 according to one or more embodiments. The V-system is depicted for the working point $\Phi_{ext}=0$. In FIG. 4, the V-system shows energy levels which are paths for readout of the qubit 100. The quantum state of the qubit 100 can be in the 0 energy, $1^{st}$ energy level, or $4^{th}$ energy level. The quantum state of the qubit 100 can transition back and forth between the 0 energy level (i.e., ground state) and the $1^{st}$ energy level due to a coupling term present between these levels. Similarly, the quantum state of the qubit 100 can also transition back and forth between the 0 energy level (i.e., ground state) and the $4^{th}$ energy level.

A readout resonator (not shown) can be coupled to the qubit 100 for inferring (i.e., reading out) the state of the qubit 100 as understood by one skilled in the art. The V-system depicts that the readout resonator can have a readout resonance frequency $f_r$ which can correspond to the $4^{th}$ energy level of the qubit 100. In this example, the $4_{th}$ energy level of the qubit 100 is about 14.6 GHz. Accordingly, the readout resonator can have a readout resonator frequency of about $f_r$=14.6 GHz in order to read out quantum state of the qubit 100. The readout can be performed by irradiating the resonator with an electromagnetic field on-resonance with the resonator frequency and observing the intensity of the signal leaving the resonator. If the intensity is weak then the measurement result is "0" while if the intensity is strong (bright) then the result is "1".

Figure 5:
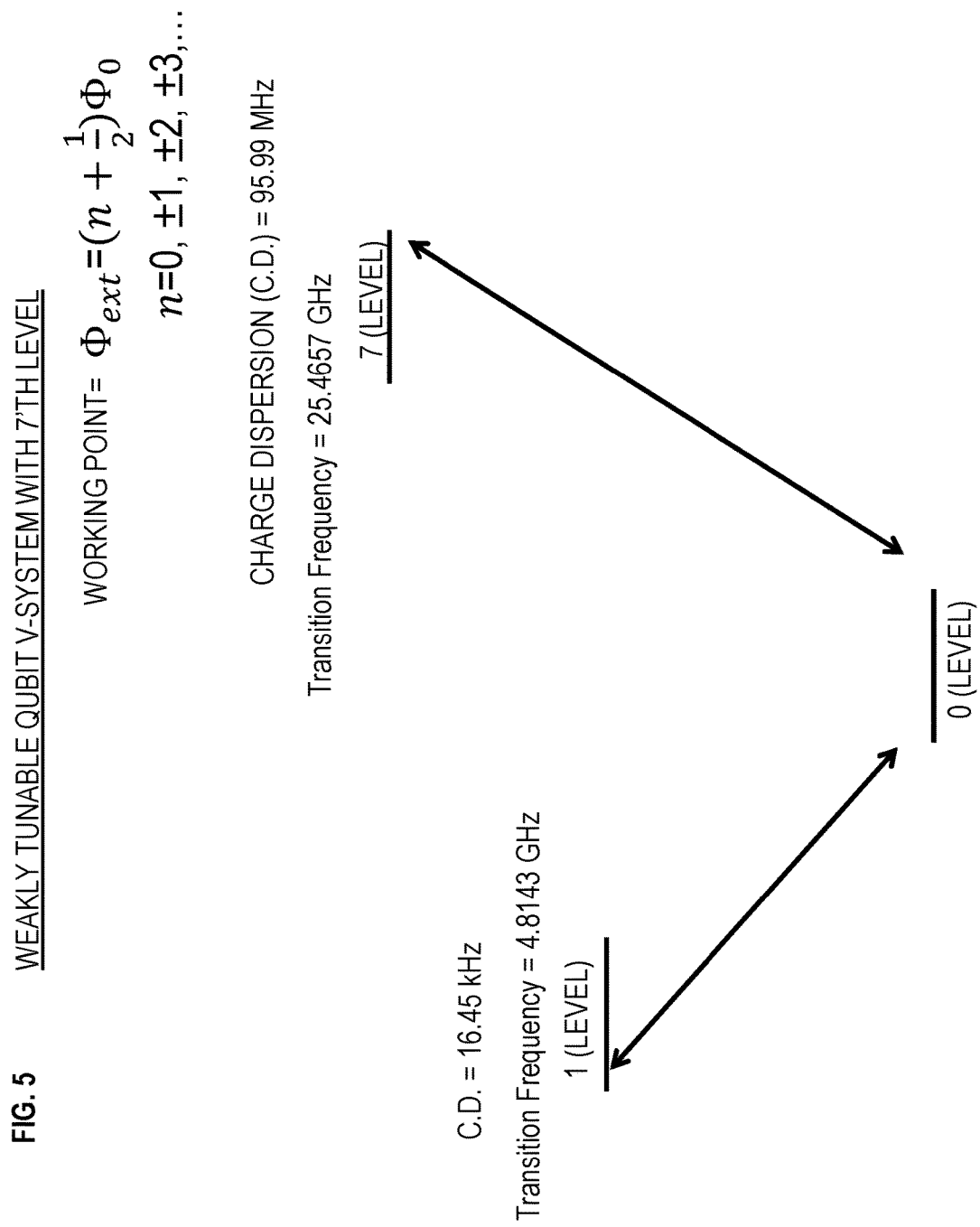
FIG. 5 is a V energy spectrum (V-system) of the qubit according to one or more embodiments.

FIG. 5 is a V energy spectrum (V-system) of the qubit 100 according to one or more embodiments. The V-system is depicted for the working point $\Phi_{ext}=\Phi_0/2$. As noted above, the V-system in FIG. 5 depicts energy levels which are paths for readout of the qubit 100. However, FIG. 5 illustrates a $7^{th}$ energy level. Accordingly, the quantum state of the qubit 100 can be in the 0 energy, $1^{st}$ energy level, or $7^{th}$ energy level. The quantum state of the qubit 100 can transition back and forth between the 0 energy level (i.e., ground state) and the $1^{st}$ energy level due to a coupling term present between these levels. Similarly, the quantum state of the qubit 100 can also transition back and forth between the 0 energy level (i.e., ground state) and the $7^{th}$ energy level.

As noted above, a readout resonator (not shown) can be coupled to the qubit 100 for inferring (i.e., reading out) the state of the qubit 100 as understood by one skilled in the art. In this case, the V-system depicts that the readout resonator can have a readout resonance frequency $f_r$ which can correspond to the $7^{th}$ energy level of the qubit 100. In this example, the $7^{th}$ energy level of the qubit 100 is about 25.46 GHz. Accordingly, the readout resonator can have a readout resonator frequency of about $f_r$=25.46 GHz in order to read out quantum state of the qubit 100. Readout can be performed in the same manner as described above for the case of the $4^{th}$ energy level.

Figure 6:
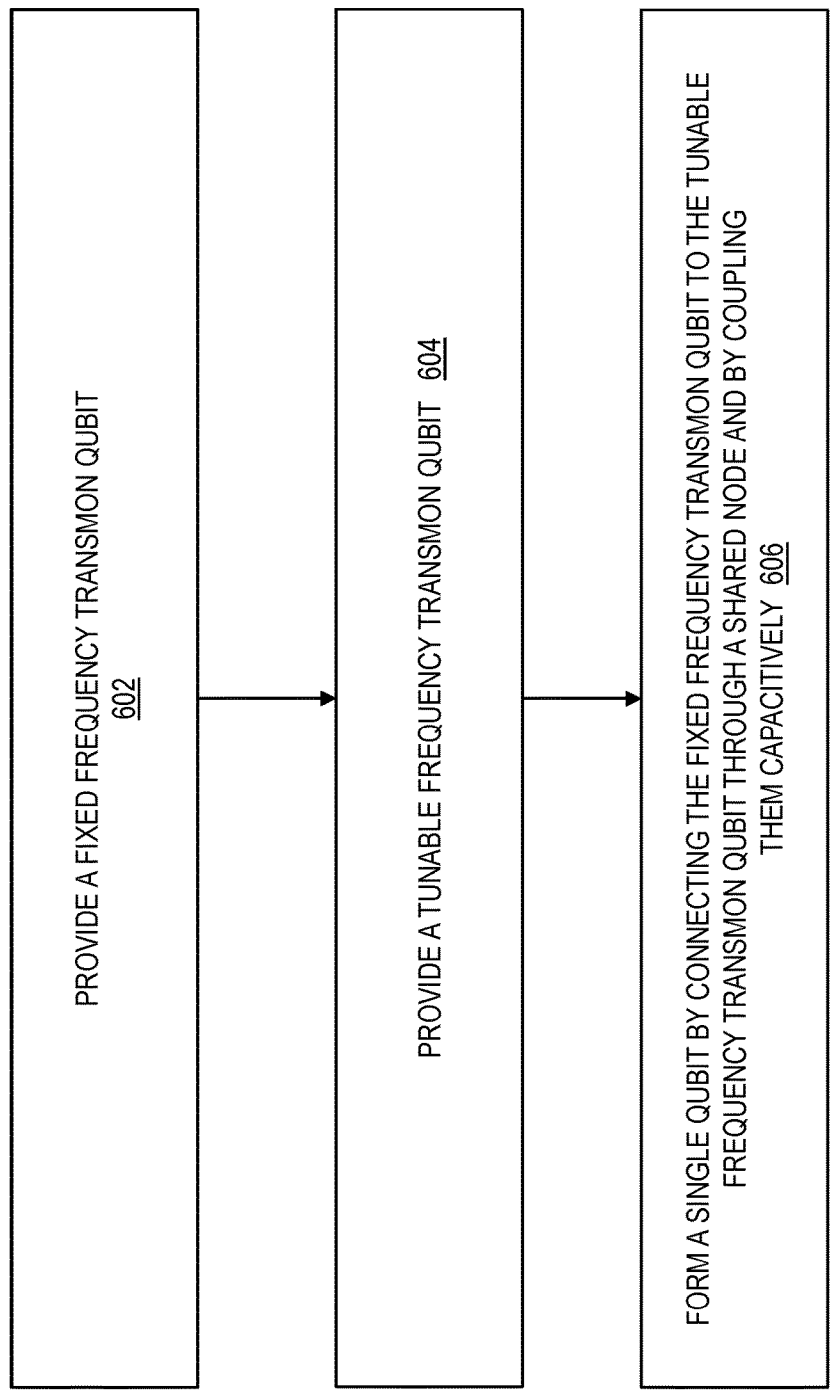
FIG. 6 is a flow chart of a method of providing a superconducting electronic device according to one or more embodiments.

FIG. 6 is a flow chart 600 of a method of providing a superconducting quantum (electronic) device (i.e., qubit circuit 100) according to one or more embodiments. Reference can be made to FIGS. 1-5.

At block 602, a fixed frequency transmon qubit 110A is provided. At block 604, a tunable frequency transmon qubit 110B is provided. At block 606, a single qubit 100 is formed by connecting the fixed frequency transmon qubit 110A to the tunable frequency transmon qubit 110B through a shared node and by coupling them capacitively.

The fixed frequency transmon qubit 110A and the tunable frequency transmon 110B share one node and are capacitively coupled via a coupling capacitor $C_C$ 120. The fixed frequency transmon qubit 110A consists of a single-JJ shunted by a first capacitor $C_1$ 122. The tunable frequency transmon qubit 110B consists of an asymmetric direct current superconducting quantum interference device (dc-SQUID) 104 shunted by a second capacitor $C_2$ 124, whose capacitance is smaller than the first capacitor 122. The dc-SQUID 104 includes two Josephson junctions (JJs), where the two JJs are a first JJ 105B and a second JJ 105A. The first JJ 105B is larger than the second JJ 105A.

A qubit frequency $f_q$ of the single qubit 100 is configured to be tuned (up or down) for a range of (±) about 150 MHz, 100 MHz, 75 MHz, 50 MHz, and/or about 25 MHz. A shift in the qubit frequency $f_q$ of the single qubit 100 is based on and/or induced by the tunable frequency transmon qubit 110B.

Figure 7:
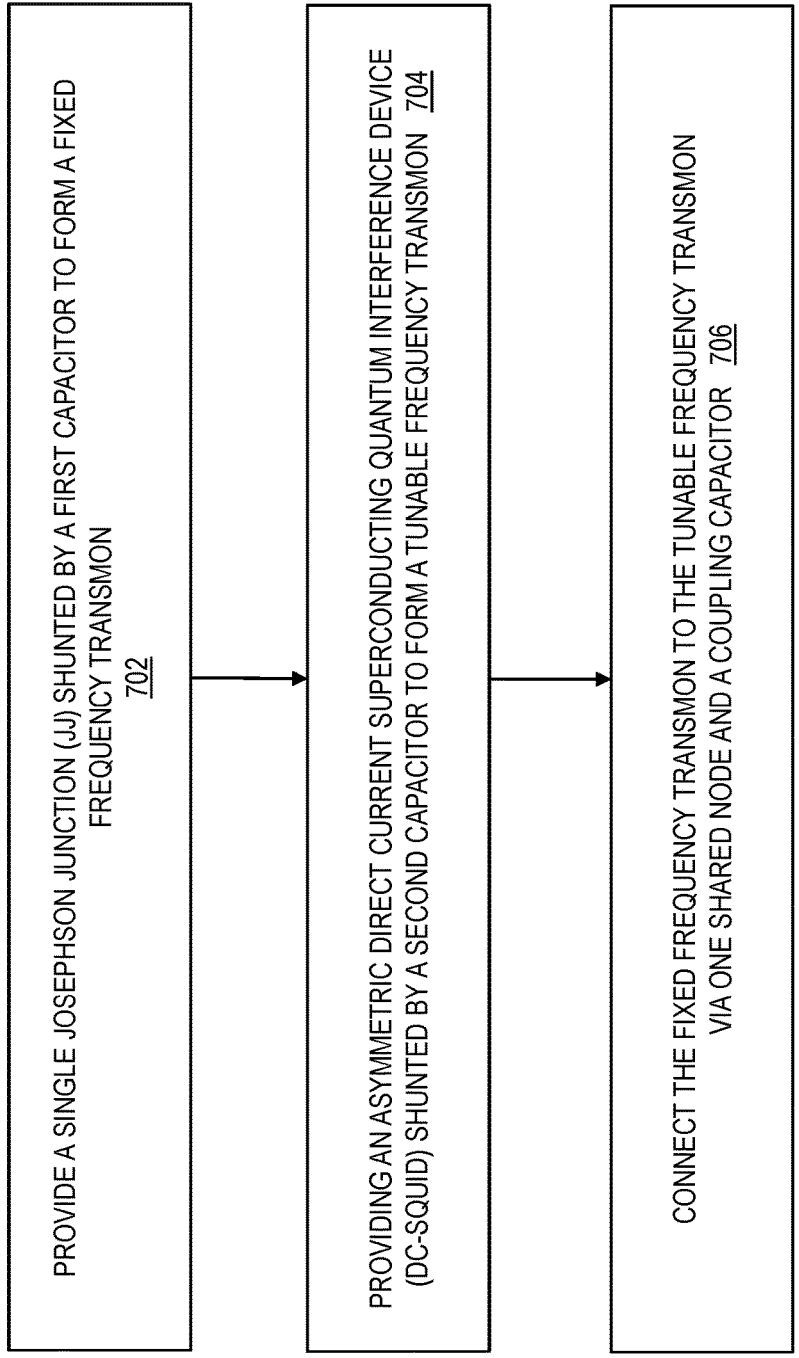
FIG. 7 is a flow chart of a method of configuring a single qubit according to one or more embodiments.

FIG. 7 is a flow chart 700 of a method of configuring a single qubit 100 according to one or more embodiments. Reference can be made to FIGS. 1-6. At block 702, a single Josephson junction (JJ) 102 shunted by a first capacitor $C_1$ 122 is provided to form a fixed frequency transmon 110A. At block 704, an asymmetric direct current superconducting quantum interference device (dc-SQUID) 104 is shunted by a second capacitor $C_2$ 124 to form a tunable frequency transmon 110B. At block 706, the fixed frequency transmon 110A is connected to the tunable frequency transmon 110B via one shared node and a coupling capacitor 120. For example, the single JJ 102 is connected to the dc-SQUID 104 through the one shared node. Moreover, the two qubits share one electrode (node) and are capacitively coupled via the coupling capacitor $C_C$ 120.

FIG. 8 is a flow chart 800 of a method of providing an energy system of a single qubit 100 for readout according to one or more embodiments. At block 802, the single qubit 100 is configured as a fixed frequency transmon qubit 110A coupled to a tunable frequency transmon qubit 110B. At block 804, the qubit 100 is configured to generate the energy system of the single qubit as a V energy system (such as in FIGS. 4 and 5) such that readout (via a readout resonator) of the single qubit 100 is configured to be performed by coupling to a $4^{th}$ energy level or a $7^{th}$ energy level of the single qubit 100.

Technical effects and benefits include a superconducting weakly tuned qubit. Technical benefits further include a qubit frequency of approximately 4.8 GHz which is in the typical 4-5 GHz range, a small charge dispersion in the range $10^{-5}$-$10^{-6}$ GHz. Technical benefits include moderate anharmonicity of approximately 260 MHz such that states 0-1 can be used as a qubit. The weakly tuned qubit can use the same fabrication process as transmons, thus requiring no extra fabrication steps. The weakly tuned qubit has a similar footprint as a typical qubit and the new qubit does not occupy larger area. Technical benefits include that the weakly tuned qubit is weakly tunable for about a 50 MHz range, thus being able to avoid frequency crowding from other qubits. The weakly tuned qubit has a reduced sensitivity to flux noise. It also has a small JJ asymmetry of about 1:3 which means less TLSs, and it can be reliably fabricated because it has similar junction areas. Additionally, the weakly tuned qubit has a V-system with single photon transitions between energy state levels 0-1 and energy state levels 0-4 for a flux bias $\Phi_{ext}=n\Phi_0$ threading the SQUID loop, where n=0, ±1, ±2, ±3, etc. Another V-system is formed with single photon transitions between energy state levels 0-1 and energy state levels 0-7 for a flux bias $\Phi_{ext}=(n+1/2)\Phi_0$ threading the SQUID loop, where n=0, ±1, ±2, ±3, etc. The $4^{th}$ state can be used to perform fast state readout by coupling the $4^{th}$ state resonantly to a readout resonator.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A method of providing a superconducting quantum device, the method comprising:
    providing a fixed frequency transmon qubit;
    providing a tunable frequency transmon qubit consisting of only a first Josephson junction, a second Josephson junction, and a capacitor, both the first and second Josephson junctions being in parallel to the capacitor; and
    coupling the fixed frequency transmon qubit to the tunable frequency transmon qubit by a direct connection to form a single qubit.

2. The method of claim 1, wherein the fixed frequency transmon qubit shares a node with the tunable frequency transmon qubit as the direct connection; and
    wherein both the fixed frequency transmon qubit and the tunable frequency transmon qubit are capacitively coupled via a coupling capacitor to form another connection.

3. The method of claim 1, wherein the fixed frequency transmon qubit is shunted by a first capacitor.

4. The method of claim 3, wherein the tunable frequency transmon qubit is shunted by the capacitor, a value of the first capacitor being greater than the capacitor.

5. The method of claim 1, wherein the tunable frequency transmon qubit is a direct current superconducting quantum interference device (dc-SQUID).

6. The method of claim 5, wherein the dc-SQUID is asymmetric.

7. The method of claim 5, wherein the dc-SQUID includes two Josephson junctions (JJs), the two JJs being the first JJ and the second JJ.

8. The method of claim 7, wherein the first JJ is larger than the second JJ.

9. The method of claim 1, wherein a qubit resonance frequency of the single qubit is defined by both the fixed frequency transmon qubit and the tunable frequency transmon qubit.

10. The method of claim 9, wherein a shift in the qubit resonance frequency of the single qubit is induced by a frequency shift in the tunable frequency transmon qubit.

11. A superconducting quantum device comprising:
    a fixed frequency transmon qubit; and
    a tunable frequency transmon qubit consisting of only a first Josephson junction, a second Josephson junction, and a capacitor, both the first and second Josephson junctions being in parallel to the capacitor, the fixed frequency transmon qubit being coupled to the tunable frequency transmon qubit by a direct connection in order to form a single qubit.

12. The quantum device of claim 11, wherein the fixed frequency transmon qubit and the tunable frequency transmon qubit share one node and are capacitively coupled via a coupling capacitor.

13. The quantum device of claim 11, wherein the fixed frequency transmon qubit is shunted by a first capacitor.

14. The quantum device of claim 13, wherein the tunable frequency transmon qubit is shunted by the capacitor, a value of the first capacitor being greater than the capacitor.

15. The quantum device of claim 11, wherein the tunable frequency transmon qubit is a direct current superconducting quantum interference device (dc-SQUID).

16. The quantum device of claim 15, wherein the dc-SQUID is asymmetric.

17. The quantum device of claim 15, wherein the dc-SQUID includes two Josephson junctions (JJs), the two JJs being the first JJ and the second JJ.

18. The quantum device of claim 17, wherein the first JJ is larger than the second JJ.

19. A method of configuring a single qubit, the method comprising:
    providing a single Josephson junction (JJ) shunted by a first capacitor which together form a fixed frequency transmon qubit;
    providing an asymmetric direct current superconducting quantum interference device (dc-SQUID) shunted by a second capacitor which together from a tunable frequency transom qubit; and
    connecting the single JJ to the dc-SQUID by a direct connection through one shared node;
    defining a qubit resonance frequency of the single qubit by both the fixed frequency transmon qubit and the tunable frequency transmon qubit.

20. The method of claim 19, wherein both the single JJ and the asymmetric dc-SQUID sharing the one shared node are capacitively coupled together via a coupling capacitor.

21. The method of claim 19, wherein a value of the first capacitor is greater than the second capacitor.

22. The method of claim 19, wherein the qubit resonance frequency of the single qubit is configured to be shifted.

23. The method of claim 22, wherein a shift in the qubit resonance frequency of the single qubit is induced by the asymmetric dc-SQUID.

24. A single qubit comprising:
a single Josephson junction (JJ) transmon qubit shunted by a first capacitor which together from a tunable frequency transmon qubit; and
an asymmetric direct current superconducting quantum interference device (dc-SQUID), the asymmetric dc-SQUID being shunted by a second capacitor which together form a tunable frequency transmon qubit;
wherein a state of the single qubit is based on a combination of the single JJ transmon qubit coupled to the asymmetric dc-SQUID;
wherein a qubit resonance frequency of the single qubit is defined by both the fixed frequency transmon qubit and the tunable frequency transmon qubit.

25. A method of providing an energy system of a single qubit, the method comprising:
providing the single qubit configured as a fixed frequency transmon qubit coupled by a direct connection to a tunable frequency transmon qubit, wherein a qubit resonance frequency of the single qubit is defined by both the fixed frequency transmon qubit and the tunable frequency transmon qubit; and
generating the energy system of the single qubit as a V energy system such that readout of the single qubit is configured to be performed by coupling to a $4^{th}$ energy level or a $7^{th}$ energy level of the single qubit.

* * * * *